United States Patent [19]

Hannah et al.

[11] 4,297,176

[45] Oct. 27, 1981

[54] SURFACE PASSIVATION OF COMPOUND SEMICONDUCTORS

[75] Inventors: Stephen J. Hannah, Cockermouth; Bryan Livingstone, Felling, both of England

[73] Assignee: National Research Development Corporation, London, England

[21] Appl. No.: 125,048

[22] Filed: Feb. 27, 1980

[30] Foreign Application Priority Data

Mar. 9, 1979 [GB] United Kingdom ............... 08453/79

[51] Int. Cl.$^3$ ............................................. C25D 11/32
[52] U.S. Cl. ............................ 204/37 R; 204/38 A; 204/56 R; 427/88
[58] Field of Search ............... 204/35 N, 37 R, 38 A, 204/42, 56 R; 427/82, 88, 126.3

[56] References Cited

U.S. PATENT DOCUMENTS 4,116,722  9/1978  Kamei et al. ................. 204/56 R X
4,133,724  1/1979  Hartnagel et al. ............... 204/38 A

FOREIGN PATENT DOCUMENTS 1530902 11/1978 United Kingdom .
1536177 12/1978 United Kingdom .

Primary Examiner—Delbert E. Gantz
Assistant Examiner—William Leader
Attorney, Agent, or Firm—Cushman, Darby & Cushman

[57] ABSTRACT

A compound semiconductor whose elements are differently volatile (e.g. GaAs, where As is more volatile than Ga) can be surface-passivated (a Ga layer overlying GaAs) by the steps of (a) anodizing a compound semiconductor to produce a layer thereon of native semiconductor oxide, (b) reducing the layer of oxide at elevated temperature and allowing the more volatile element of the reduced oxide to evaporate away, to leave predominantly the less volatile element overlying the compound semiconductor, (c) depositing an anodizable metal on the surface of the less volatile element, (d) re-anodizing the resulting structure until oxidation has proceeded to beyond the layer containing predominantly the less volatile element and from 10 Å to 50 Å into the compound semiconductor, and optionally at any suitable stage (e) applying an ohmic contact to the back surface of the compound semiconductor or selectively to the top surface as required.

17 Claims, No Drawings

SURFACE PASSIVATION OF COMPOUND SEMICONDUCTORS

This invention relates to a method of surface passivation of compound semiconductors. When a surface-passivated compound semiconductor has an overlaid composite oxide layer, as will be described, the result will be that the number of surface states at the oxide/semiconductor interface is reduced to an amount making practicable, in the case of indium phosphide for example, both accumulation and inversion, while with gallium arsenide, inversion and flat-band conditions have been obtained. The surface passivation may be applied to selected areas, as in MIS (metal-insulator-semiconductor) type active devices.

The invention accordingly consists in surface-passivating a compound semiconductor whose elements are differently volatile by the steps of (a) anodising a compound semiconductor to produce a layer thereon of native semiconductor oxide, (b) reducing the layer of oxide at elevated temperature and allowing the more volatile element of the reduced oxide to evaporate away, to leave predominantly the less volatile element overlying the compound semiconductor, (c) depositing an anodisable metal on the surface of the less volatile element, (d) re-anodising the resulting structure until oxidation has proceeded to beyond the layer containing predominantly the less volatile element and from 10 Å to 50 Å into the compound semiconductor, and optionally at any suitable stage (e) applying an ohmic contact to the back surface of the compound semiconductor or selectively to the top surface as required. Alternatively to steps (c) and (d), the less volatile element may be oxidised (e.g. anodically or by plasma) to the extent specified in (d), and then a dielectric may be deposited on the surface of the oxide of the less volatile element.

Before or after the ohmic contact is applied, the structure may be annealed, preferably at 320–380 C. for GaAs or 280–350 C. for InP, preferably in nitrogen, and preferably for 10–30 minutes. At this stage, field plates may be applied to the surface of the structure.

The native semiconductor oxide is anodised in step (a) to form an oxide layer preferably 30 Å–400 Å thick, more preferably 50 Å–150 Å thick. Excessive thicknesses would make for difficulties in step (b) and would also mean that the properties of the resulting device would be mainly influenced by the oxide of the less volatile element. The current density of anodising is not critical but if excessively low (say 30 $\mu A/cm^2$) oxidation might be slower than the rate of dissolution of the semiconductor in the electrolyte. At excessively high current densities (say 10 $mA/cm^2$) the oxide grows non-uniformly.

The compound semiconductor is preferably a III/V semiconductor, for example gallium arsenide (GaAs) or indium phosphide (InP).

In step (b), the reduction is preferably performed in hydrogen, preferably at 400 C.–700 C. (more preferably 500 C.–650 C.) in the case of GaAS, and preferably at 300 C.–500 C. (more preferably 350 C.–450 C.) in the case of InP, for a duration sufficient to reduce all the oxide to its elements and to leave a layer, overlying the compound semiconductor, consisting predominantly of the less volatile of the elements (i.e. in the above examples, gallium or indium). Note that GaAs thus oxidised and reduced no longer has the gallium arsenide crystal structure but a gallium-plus-arsenic structure. The temperature is selected to encourage the reduction and to volatilise the (for example) arsenic or phosphorus, without boiling the less volatile element.

In this way, a predominantly gallium layer can be obtained overlying gallium arsenide (for example). This could not be achieved by merely depositing gallium on to gallium arsenide except under very special conditions, since there is almost inevitably some native oxide or impurity on any exposed gallium arsenide surface. Similarly with indium phosphide.

In step (c), the anodisable metal may be zinc, nickel or a valve metal (tantalum, hafnium, zirconium, titanium or aluminium), which may be deposited (e.g. by evaporation or sputtering) on the less volatile element.

Anodisation is not terminated with oxidation of the metal but is continued, as step (d), until all of the less volatile element is oxidised and until the oxidation has proceeded from 10 Å to 50 Å into the compound semiconductor. Between the layer containing predominantly the less volatile element and the compound semiconductor, there is believed to be a transitional region around 10 Å thick.

The anodisation current density may be from 10 $\mu A$ to 1 mA per square centimeter, and may influence the location of oxide formation according to the principles expounded in Patent Specification No. 1536177.

The contact pads may be of any metal, for example aluminium, and may constitute gates or field plates.

The invention will now be described by way of example.

EXAMPLE 1

A block of n-type gallium arsenide, having a carrier concentration of $2 \times 10^{16}/cm^3$, was anodised in strong light. (In the case of p-type, it would not matter whether it was in the light or dark.) The electrolyte used in the anodising had been prepared by producing a 3% aqueous solution of tartaric acid. Then 2 volumes of propylene glycol were added to 1 volume of the aqueous tartaric acid.

The current density for the anodisation was 1 $mA/cm^2$ and anodisation was continued until a thickness of 100 Å of native oxide had formed on the gallium arsenide. This thickness corresponded to an overpotential increase of 5 volts. Under these conditions, this took about 12 seconds. (In another experiment, 80 Å of native oxide worked just as well.)

The native oxide was then reduced at 600°C. in hydrogen at 1 atmosphere for 10 minutes. This was sufficient to reduce all the native oxide (gallium oxide and arsenious trioxide) and to boil off the arsenic, leaving a surface layer some 40 Å deep predominantly of metallic gallium. The gallium-rich surface confutes the immutability of excess arsenic (or gallium vacancies) at the GaAs/GaAs-oxide interface, and paves the way for a low density of surface states, thus permitting band-bending, the mechanism by which metal-oxide semiconductor devices work.

Aluminium was then evaporated on to the surface of the predominantly gallium layer, to form a layer 500 Å thick.

With the GaAs/Ga/Al as anode, and only the aluminium being exposed to electrolyte, electrolysis was performed in the dark in the same electrolyte as mentioned previously, held to a current density of 100 $\mu A/cm^2$. Electrolysis was continued until all the aluminium, all the 'pure' gallium and 20 Å of the gallium arsenide had been anodically oxidised.

There are various ways of monitoring when the gallium arsenide has just started to oxidise, for example, an optical monitoring of the reflectivity of the device. In practice, the overpotential/time curve of the anodisation is a convenient and reliable monitor. As the aluminium oxidises, the overpotential rises steadily with time. This stage took approximately 20 minutes. The overpotential then rises more sharply, shows an inflection, rises sharply again (due to the formation of a space charge layer in the dark) and then rises at a steady easier gradient. The initial sharper rise (about 4 V) and inflection take about 1 minute and represent oxidation of the 'pure' gallium. The second sharp rise (about 25 V) is all over in less than a minute (depending on the light intensity and doping level), and for best results the anodisation is discontinued not too near the start nor too near the finish of this second sharp rise, and in our experiment was discontinued after 10–30 seconds.

The overpotential-time curve is a little simpler in the case of p-type gallium arsenide. The initial steady rise of overpotential with time as the aluminium is oxidised is the same. There is then a sharp rise (about 4 V), representing oxidation of 'pure' gallium, lasting about 1 minute, and then a continuing rise at an easier gradient representing gallium arsenide oxidation. The anodisation in this case is discontinued about 10–30 seconds into this continuing rise.

Then field plates were applied to the anodised structure and, if desired, ohmic contact layers at the back. The structure was annealed for 15 minutes at 350° C. in nitrogen.

The resulting device was used as an MIS diode.

EXAMPLE 2

Using n-type indium phosphide having a carrier concentration of $10^{15}/cm^3$ instead of gallium arsenide, Example 1 was repeated except for the following variations. The InP was in the form of a 5-micron-thick epitaxial layer on an InP single crystal substrate having a carrier concentration of $10^{18}/cm^3$.

The current density for the initial anodisation was 200 $\mu A/cm^2$, and the same thickness of native oxide was attained (100 Å), but this took about 1 minute.

The reduction was performed at 400° C. A temperature of 600° C. would have been definitely too high, leading to etch pits. Even 500° C. leads to fairly violent volatilisation.

The final anodisation was also performed at 200 $\mu A/cm^2$, so that the various durations were approximately halved compared with Example 1, where the corresponding anodisation was performed at half this current density.

The sharp rise in overpotential due to the space charge (about 25 V in Example 1) amounted to about 120 V in this Example. The resulting device was used as an MIS diode.

We claim:

1. A method of surface-passivating a compound semiconductor whose elements are differently volatile, comprising the steps of (a) anodising a compound semiconductor to produce a layer thereon of native semiconductor oxide, (b) reducing all of the layer of oxide at elevated temperature and allowing the more volatile element of the reduced oxide to evaporate away, to leave predominantly the less volatile element overlying the compound semiconductor, (c) depositing an anodisable metal on the surface of the less volatile element, (d) re-anodising the resulting structure until oxidation has proceeded to beyond the layer containing predominantly the less volatile element and from 10 Å to 50 Å into the compound semiconductor, and optionally at any suitable stage (e) applying an ohmic contact to the back surface of the compound semiconductor or selectively to the top surface as required.

2. The method of claim 1, wherein the compound semiconductor is a III/V semiconductor.

3. The method of claim 2, wherein the semiconductor is gallium arsenide.

4. The method of claim 3, wherein the structure is annealed at 320 to 380 C.

5. The method of claim 3, wherein in step (b) the reduction is at 400 C. to 700 C.

6. The method of claim 2, wherein the semiconductor is indium phosphide.

7. The method of claim 6, wherein the structure is annealed at 280 to 350 C.

8. The method of claim 6, wherein in step (b) the reduction is at 300 C. to 500 C.

9. The method of claim 1, wherein the structure is annealed.

10. The method of claim 9, wherein the annealing is performed in nitrogen.

11. The method of claim 9, wherein the annealing is for 10 to 30 minutes.

12. The method of claim 1, wherein in step (a) the native oxide produced is 30 Å to 400 Å thick.

13. The method of claim 12, wherein the native oxide produced is 50 Å to 150 Å thick.

14. The method of claim 1, wherein in step (b) the reduction is performed in hydrogen.

15. The method of claim 1, wherein in step (c) the anodisable metal is any one of zinc, nickel, tantalum, hafnium, zirconium, titanium and aluminium.

16. A method of surface-passivating a compound semiconductor whose elements are differently volatile, comprising the steps of (a) anodising a compound semiconductor to produce a layer thereon of native semiconductor oxide, (b) reducing all of the layer of oxide at elevated temperature and allowing the more volatile element of the reduced oxide to evaporate away, to leave predominantly the less volatile element overlying the compound semiconductor, (c') oxidising the less volatile element until oxidation has proceeded to beyond the layer containing predominantly the less volatile element and from 10 A to 50 A into the compound semiconductor, (d') depositing a dielectric on the oxidised surface, and optionally at any suitable stage (e) applying an ohmic contact to the back surface of the compound semiconductor or selectively to the top surface as required.

17. The method of claim 16, wherein the oxidising (c') is by one of anodisation and plasma.

* * * * *